United States Patent [19]

Burr

[11] 4,450,623
[45] May 29, 1984

[54] PROCESS FOR THE MANUFACTURE OF CIRCUIT BOARDS

[75] Inventor: Robert P. Burr, Matinicus, Me.

[73] Assignee: Kollmorgen Technologies Corporation, Dallas, Tex.

[21] Appl. No.: 332,346

[22] Filed: Dec. 18, 1981

[51] Int. Cl.³ ............................................. H01K 3/10
[52] U.S. Cl. .................................... 29/850; 174/68.5
[58] Field of Search ............... 29/848, 850, 831, 840, 29/834; 228/5.1, 4.5; 339/17 C; 174/68.5

[56] References Cited

U.S. PATENT DOCUMENTS

| | | | |
|---|---|---|---|
| 3,353,263 | 11/1967 | Helms | 29/840 X |
| 3,608,190 | 9/1971 | Steranko et al. | 29/834 X |
| 3,674,602 | 7/1972 | Keogh et al. | |
| 3,674,914 | 7/1972 | Burr | |
| 3,701,838 | 10/1972 | Olney, Jr. | 339/17 C X |
| 3,981,076 | 9/1976 | Nicolas | 29/850 X |
| 4,031,612 | 6/1977 | Nicolas | 29/850 |
| 4,065,850 | 1/1970 | Burr et al. | |
| 4,094,572 | 6/1978 | Burr et al. | |
| 4,175,816 | 11/1979 | Burr et al. | |
| 4,337,573 | 7/1982 | Nicolas et al. | 29/831 |

FOREIGN PATENT DOCUMENTS 47904 4/1979 U.S.S.R. ................... 29/848

Primary Examiner—Howard N. Goldberg
Assistant Examiner—Carl J. Arbes
Attorney, Agent, or Firm—Morgan, Finnegan, Pine, Foley & Lee

[57] ABSTRACT

A process for extending and fixing conductors to circuit board base surfaces between pre-established spaced points in straight paths and pre-established spaced points in inflected paths, the steps comprising, fixing the end of the conductor to a pad at the first of a pair of pre-selected points and, while feeding the conductor with a guide, moving the board and the guide relative to each other along a straight path to a pad at the second of the pair of pre-established points or to a pad at an inflection point, if the conductor is to be inflected, and then to said second pad. Severing said conductor at said second pad and affixing the conductor end to said second pad. Repeating the foregoing steps until the conductor has been affixed to the pre-established pairs of pads and to the pads at the inflection points. After all of the pre-established spaced points have been interconnected with conductors either in straight or inflected paths, affixing the conductors to the board blank surface with a adhesive by applying pressure to the conductor pattern.

17 Claims, 26 Drawing Figures

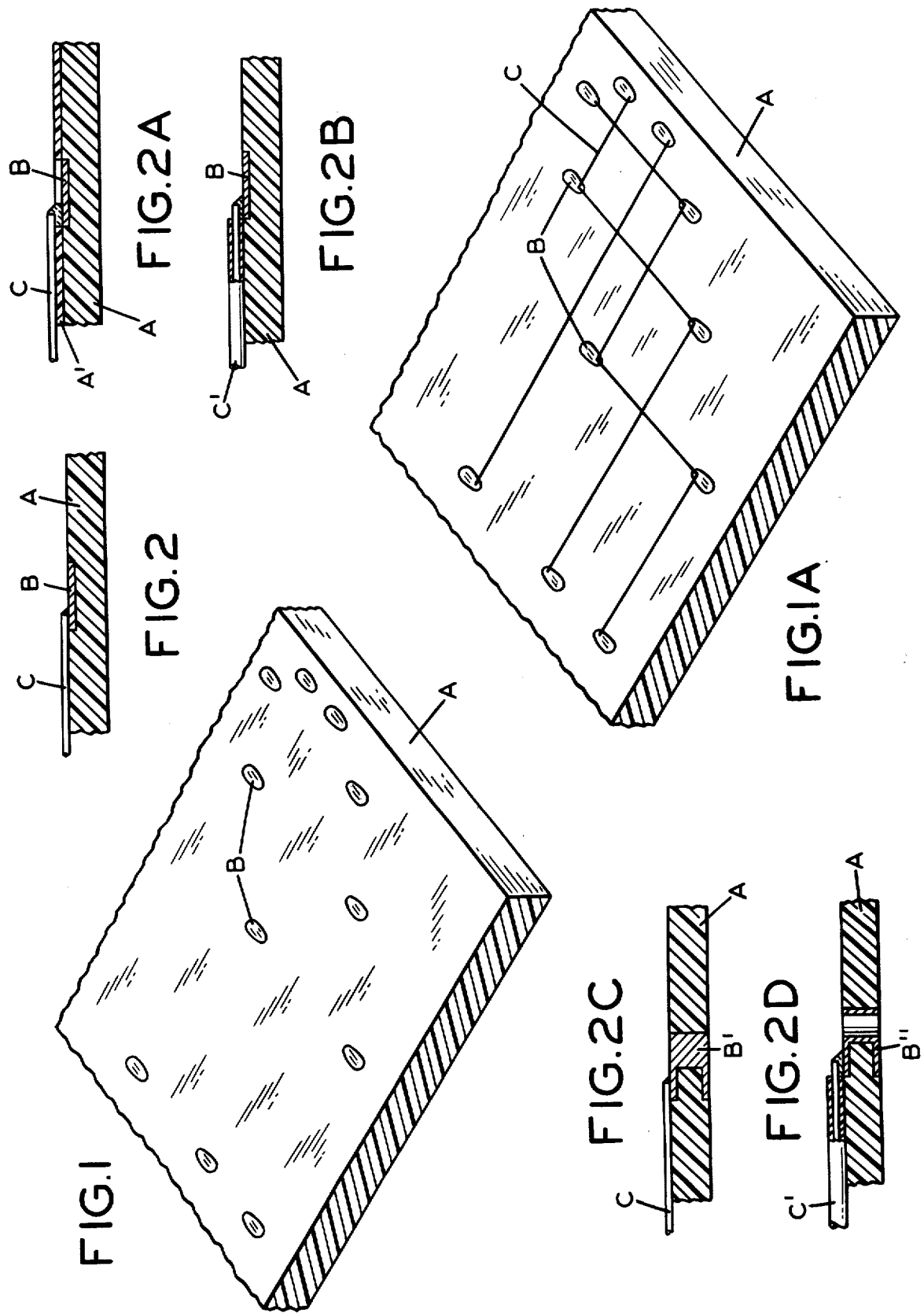

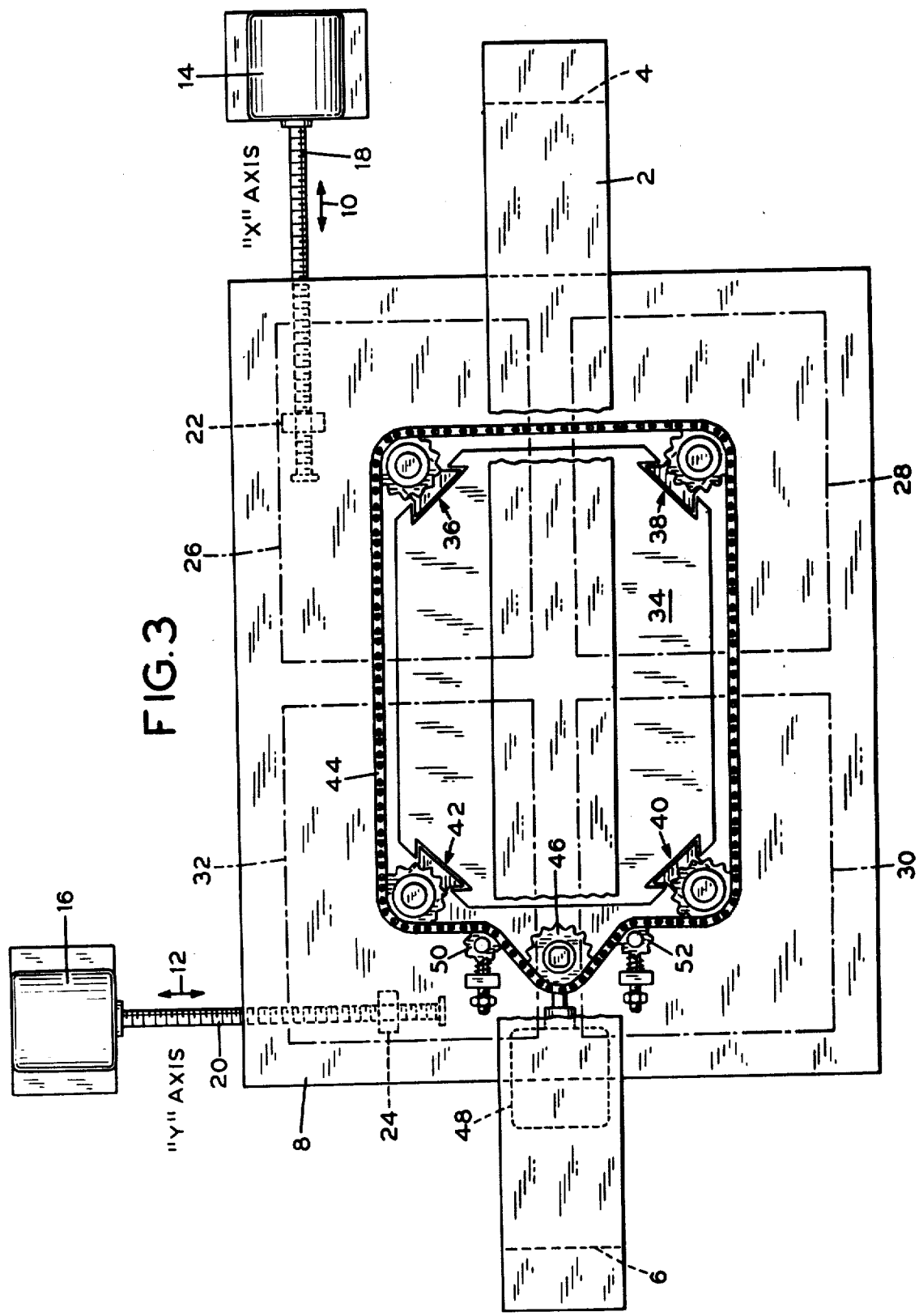

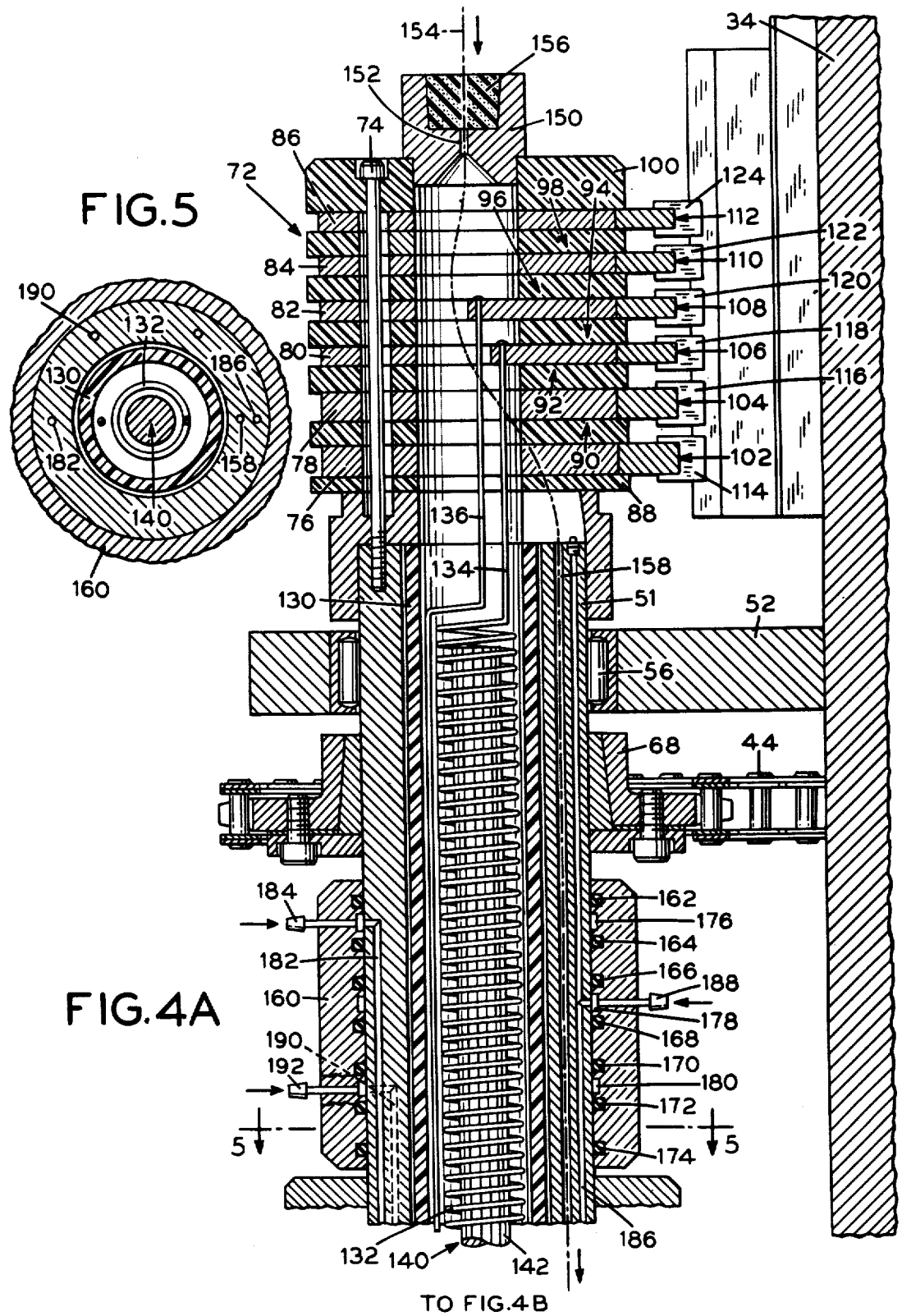

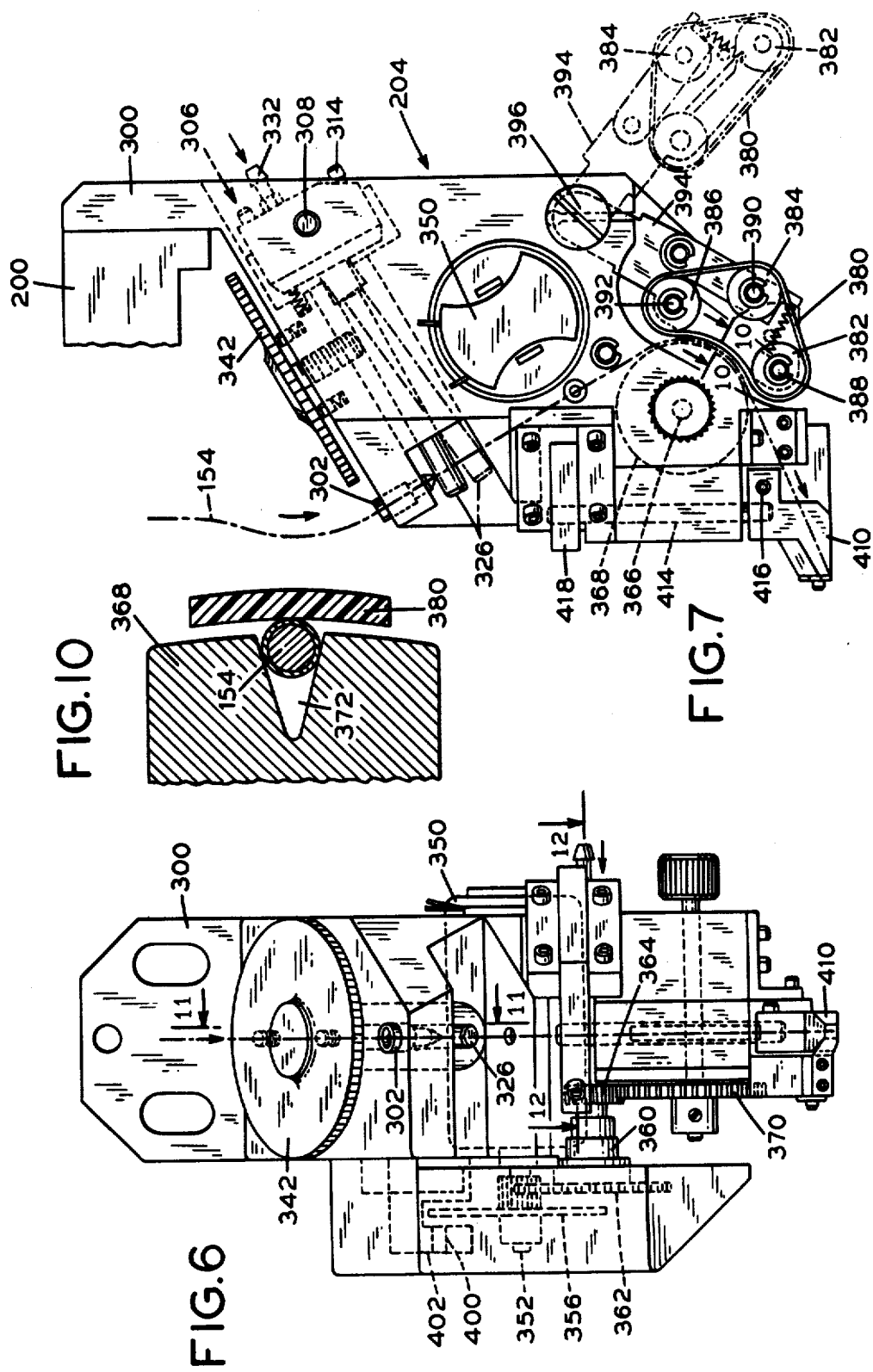

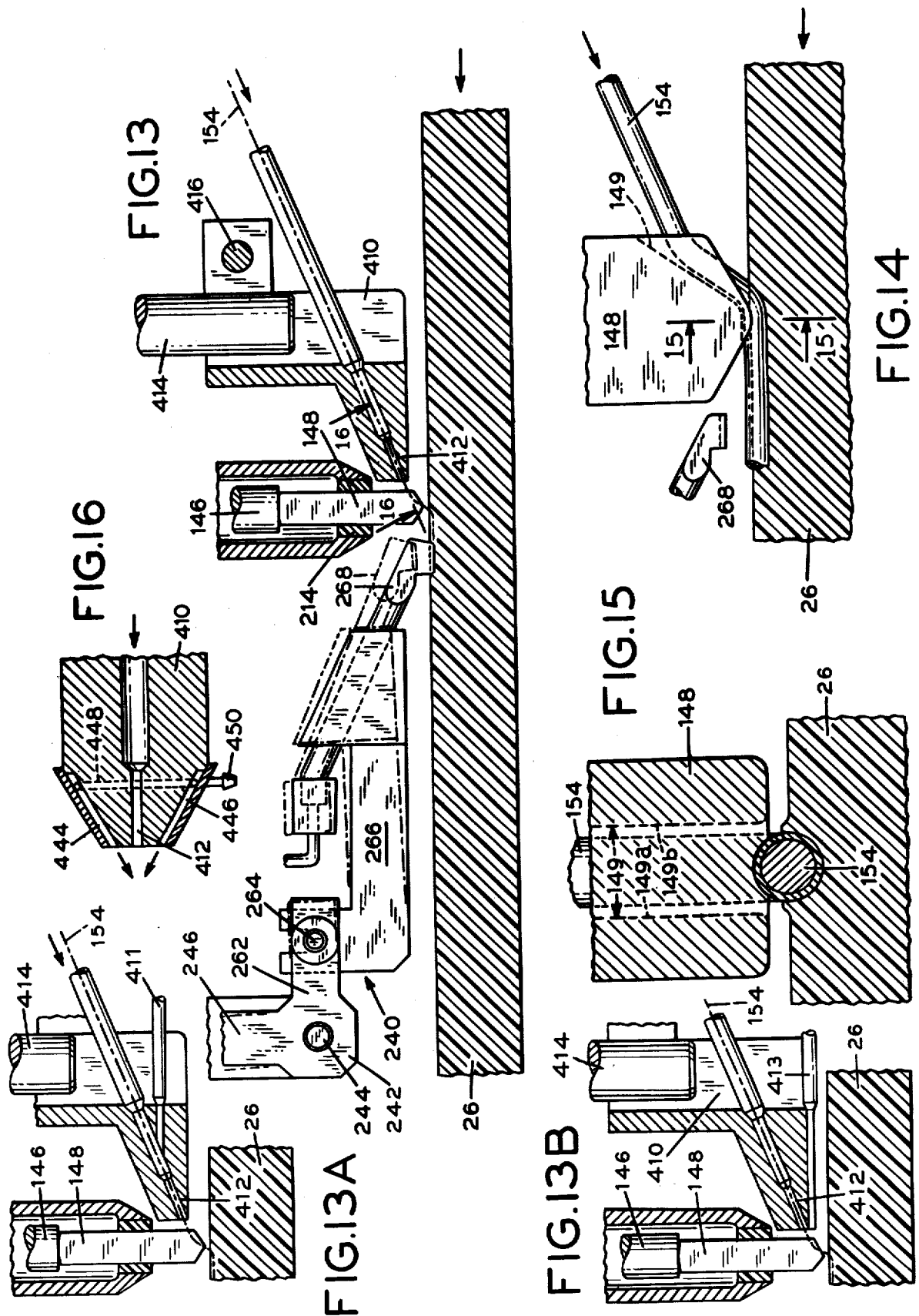

PROCESS FOR THE MANUFACTURE OF CIRCUIT BOARDS

This invention relates to wire scribed circuit boards for interconnecting electrical and electronic components and to methods and apparatus for the manufacture thereof.

U.S. Pat. No. 3,673,681, dated July 4, 1972, shows and describes a method and apparatus for wiring an electrical circuit on a circuit board by bonding an insulated wire to metal pads on the circuit board for electrically interconnecting circuit components. In such patent, the insulated wire is fed from a supply reel or coil through the soldering tip of a head. The end of the wire is soldered through heat applied by the tip head to a metal pad on a circuit board. The board and tip head are then moved relative to each other. While the board and tip head are being moved relative to each other, the wire soldered at its end to the board pad is pulled through the head. After the desired length of wire has been fed through the head to the board, the relative movement of the head and board is stopped, the wire adjacent the soldering head tip is soldered to a second metal pad on the circuit board and the wire is then severed. This operation is repeated until all of the desired wires on the board have been applied with their ends affixed to such metal pads.

One of the difficulties with the arrangement of this '681 patent is that, intermediate the points where such wire is soldered to the metal pads, the wire is loose and free of the board. Thus, there is no control over exact positioning of the wire intermediate the solder pads and such wire is subject to being snagged, caught, pulled and damaged. Care must be exercised in the handling and use of such board after wiring.

U.S. Pat. Nos. 3,674,602 and 3,674,914, both dated July 4, 1972, and U.S. patent application Ser. No. 823,153, filed Aug. 9, 1977, now abandoned, show and describe methods and apparatus for wiring an electrical circuit on a circuit board in which a conductor or wire is scribed or written onto an adhesive activatable surface of a circuit board blank and affixed by activating the adhesive on such surface as such conductor or wire is applied to the surface. The apparatus is controlled through a program on magnetic tape, paper tape, punch cards and the like fed through appropriate controls for producing and duplicating circuit boards. The conductor or wire is precisely applied and precisely affixed to the board surface by the activated adhesive. Circuit boards in substantial variety and in substantial numbers have been produced following the teachings of such '602 and '914 patents and '153 application and have found a wide variety of uses.

In the method and apparatus of the '602 and '914 patents and '153 application, the wire to be scribed or written onto the board blank is fed to a guide tool which engages the wire with the board blank surface and heats such surface to soften and activate the adhesive thereon. The guide tool and board blank are moved relative to each other along the path in which the wire is to be scribed or written. The guide tool, in addition to feeding and guiding the wire along the path, also softens and activates the adhesive on the base along such path to fix and attach the wire to the base. To assure proper heating and softening of the adhesive on the base to fix and attach the wire and, at the same time, avoid over softening and possible damage to the base and circuits scribed thereon, the quality and quantity of the adhesive applied to the base must be controlled and the speed at which the guide tool and board blank are moved, relative to each other, must be regulated. This reduces the speed at which such circuit boards might otherwise be produced, reduces the efficiency of the apparatus and increases the cost of such circuit boards.

In the instant invention the difficulties heretofore encountered where the conductor or wire is soldered to metal pads on the board at the conductor or wire ends and left loose and free of the board intermediate such soldered ends are overcome or avoided. The speed at which such circuit boards might be scribed or written is increased and the cost of producing such boards is reduced. This is accomplished in the instant invention with apparatus which aligns the lead end of the conductor or wire to be applied to the base with a metal pad on the base and by then solders, brazes or welds such lead conductor end to such metal pad. The wire supply is then moved relative to the base to feed a precise length of conductor or wire to the base. The end of the precise conductor or wire length is then fixed or attached to a second metal pad on the base and the conductor or wire is cut leaving a new conductor or wire lead end. This new lead end is then aligned with a metal pad on the base and the feeding, fixing of the end of the fed length to a second metal pad and cutting is repeated. The sequence is repeated until all of the conductors to be applied to the board are in place. The board is then removed from the scribing apparatus and transferred to a press where the conductors or wires otherwise free of the board base intermediate the soldered, brazed or welded ends are fixed to the base along their lengths. This might be accomplished by activating a material already on the base surface or on the conductors or wires when such conductors or wires are scribed onto the board surface or may be applied to the conductors or wires and base after scribing. Such materials might be chemically, physically or mechanically activated or activated by a combination thereof. Partially cured, thermosettable materials have been found to be particularly suited for such use.

The circuit board blank utilized in the practice of the invention of the present application, may have an adhesive coating, as in the boards of the '602 and '914 patents and '153 application, or may be an uncoated board as in the '681 patent. The board may be pre-drilled before wiring, post drilled after wiring or may be undrilled. In any event and for reasons more apparent later herein, the circuit board blank utilized in the instant invention include an electrical insulating base or surface having exposed on such surface at each point where the scribing or writing of a wire or conductor is to begin and where the scribing or writing of each conductor is to end a metal pad. Intermediate such pads and along the path upon which the wire is to be scribed or written, additional metal pads or adhesive pads may be provided especially at points where the direction of the scribing or writing of the wire on the board is to be abruptly changed. The metal pads may be limited to the surface upon which the wire is to be scribed or written or may extend through the board blank from the opposite surfaces and provide conductors between such surfaces for interconnecting circuits or components thereon. The metal pads may be molded into the board blank, if the blank material is molded, or may be added and affixed to the board such as with an adhesive, mechanical means or other attaching means which will affix and maintain the metal pad on the board blank during wire scribing or writing and processing and which will not interfere therewith.

The wire to be scribed or written in the instant invention and for wiring the circuit board produced thereby may be monofilament or may be made up of a plurality of filaments or strands twisted to form a single conductor. The wire might be insulated or uninsulated, coated or uncoated and, where coated, the coating might be adherent to the strand or non-adherent. Non-adherent insulation might be employed where mechanical stripping of the wire is desired.

The apparatus for carrying out the method and for producing the wire scribed or wire written circuit board of the instant invention may be the apparatus of either of the aforementioned '602 or '914 patents or the apparatus of the aforementioned '153 application. Preferably, as will be described, the apparatus of the aforementioned application, with certain modifications as will be described, is employed.

In the practice of the instant invention, the circuit board blank to be wired is mounted on the apparatus table with the surface having the wiring pads facing up and facing the wiring head. The board is clamped to the table and indexed to the program for scribing or writing the wire thereon. For production purposes, equipment utilization and economy, a plurality of circuit boards might be simultaneously processed.

The wire to be scribed and affixed to the board blank in accordance with the instant invention is fed through the wiring head, brought into engagement with the board surface and scribed or written onto the board as the board and wiring head are moved relative to each other in the pre-programmed direction much in the same manner as in the aforementioned '602 and '153 patents and '153 patent application. In the instant invention, however, the end of the wire strand is affixed to a metal pad on the circuit board blank before the board and wiring head are moved relative to each other. At its opposite end, the wire strand is again affixed to a metal pad on the circuit board blank at the end of the scribed conductor. Where the conductor is of substantial length or, as scribed, undergoes abrupt changes in directions, the wire is preferably affixed, intermediate its ends, to additional metal pads or to adhesive pads located and pre-fixed to the circuit board blank to conform to the pre-programmed wiring pattern and to accommodate such wire fixing.

The feed of the conductor or wire to be scribed and affixed to the board blank in the practice of the instant invention is a positive feed. That is, the length of conductor or wire feed is determined by the distance of relative movement between the guide head and the board, as such conductor or wire is fed. This may be accomplished, for example, in the apparatus of the '602 and '914 patents by applying a drag to the conductor or wire in the feed from the guide head in such apparatus so that the wire is only pulled from the guide head and supply while the head and board are moving relative to each other and then only in direct relationship to the distance of such movements. Preferably, such positive feed is accomplished through a conductor or wire feed motor drive interconnected with the table motor drive so that the unit feed of conductor is coordinated with table movement. In this manner, as will be more fully described later herein, positive feed of the conductor or wire to the table is integrated with table movement assuring feed of the required length of conductor or wire without over-feed or damage to the conductor or wire. This is of particular importance in the feeding of smaller conductors or wires where stretching and breaking may occur. Such motor driven conductor feed also allows more rapid start-up and stops important to the economy and efficiency of the instant invention.

After scribing and fixing of the opposite end of the conductors or wires to the metal pads on the board have been completed, the wire scribed board is removed from the scribing apparatus and transferred to a press. Where the board blank was precoated with a pressure or temperature responsive adhesive before scribing such transfer may be made directly from the scribing apparatus. Where the precoating requires activation by a solvent, radiation, or the like, or the coating or adhesive is to be added after scribing, this is accomplished during transfer and before the scribed board is placed in the press. The coating or adhesive after scribing might be applied as an overlay sheet or as an overlay configured to conform to the scribed configuration on the board. In any event, the scribed conductors or wires are pressed into the adhesive in the press so as to adhesively affix the conductors along their length to the circuit board surface. Preferably, the adhesive is thermoplastic or thermosetting and the press is heated.

The circuit board with the conductors or wires scribed thereon, soldered, brazed or welded at their ends to the metal pads and adhesively affixed intermediate such ends to the board surface is removed from the press and processed in conventional manner. The wired circuit board might then be drilled, the holes plated and components might be added and connected to the board and conductors in conventional manner.

In the instant invention, tacking or fastening of the conductor or wire as it is being scribed or written is eliminated. The wire or conductor is connected at its ends and, where desired, intermediate its ends while the circuit board and the wiring head are stationary. Optimum conditions of heat, pressure, and the like can be applied to the conductor and metal pads to affix the wire without concern for the circuit board material. Similarly, while the wire or conductor is being scribed or applied to the base by movement of the wiring head and base relative to each other no concern for heating and activating of the board surface to affix and attach the wire, as in the aforementioned '602 and '914 patents and '153 patent application, is required. Scribing or applying the wire or conductor to the base may be accomplished at a much higher speed and much faster rate. Machine and control time, per unit board produced, is therefore reduced. Subsequent adhering or affixing the wire or conductor length to the base can be carried out with the conductor and base static or stationary. Optimum conditions for adhering or affixing the wire or conductor to the base may be followed.

While wire is most adaptable for handling and feed and is preferred in the practice of the instant invention, other conductors such as metal tapes or foil, optical fibers, either monofilament or plural filament, hydraulic or air tubing and the like might be employed as the conductor. The conductor may be insulated or uninsulated and, where uninsulated and one conductor is to cross another insulation in the form of a band or tape might be applied between the conductors at and adjacent to the crossing point as one conductor is being applied across the other. Likewise, a band or tape of adhesive material, either active at the time or later to be activated by heat, a solvent or other activation means, might be applied to the conductor or between the conductor and base surface as such conductor is applied to such base.

The invention of the instant application will be more fully described and will be better understood from the following description of a preferred embodiment, taken with the appended drawings in which:

FIG. 1 is a perspective view illustrating one form of the circuit board blank of the instant invention;

FIG. 1A is a view, similar to FIG. 1, and showing the circuit board blank with conductors applied thereto in accordance with the invention;

FIGS. 2-2D are sectional views showing various modifications of the current board blank and circuit board of FIGS. 1 and 2;

FIG. 3 is a diagrammatic top plan view of the apparatus showing an arrangement of multiple units for simultaneously practicing the method and producing multiple scribed circuit boards of the invention;

FIG. 4A is an enlarged side view, in section, of the upper portion of one of the units of FIG. 3;

FIG. 5 is a sectional view taken at 5—5 in FIG. 2A;

FIG. 6 is a front view, facing toward the feed, of the wire strand feed apparatus of the unit of FIG. 4B;

FIG. 7 is a view of one side of the feed apparatus of FIG. 6 with a part of the apparatus open;

FIG. 10 is a partial sectional view taken at 10—10, FIG. 7;

FIG. 13 is an enlarged partial view of the lower end of the apparatus of FIG. 4B showing such end in enlarged detail;

FIG. 13A is a partial view of the apparatus of FIG. 13 showing a modification of such apparatus;

FIG. 13B is a view similar to FIG. 13A but showing another modification;

FIG. 14 is an enlarged view of a portion of the apparatus of FIG. 13 showing the stylus and wire strand in enlarged detail;

FIG. 15 is an enlarged partial sectional view taken at 15—15, FIG. 14;

FIG. 16 is an enlarged view taken at 16—16, FIG. 13; and

Figure 4B:
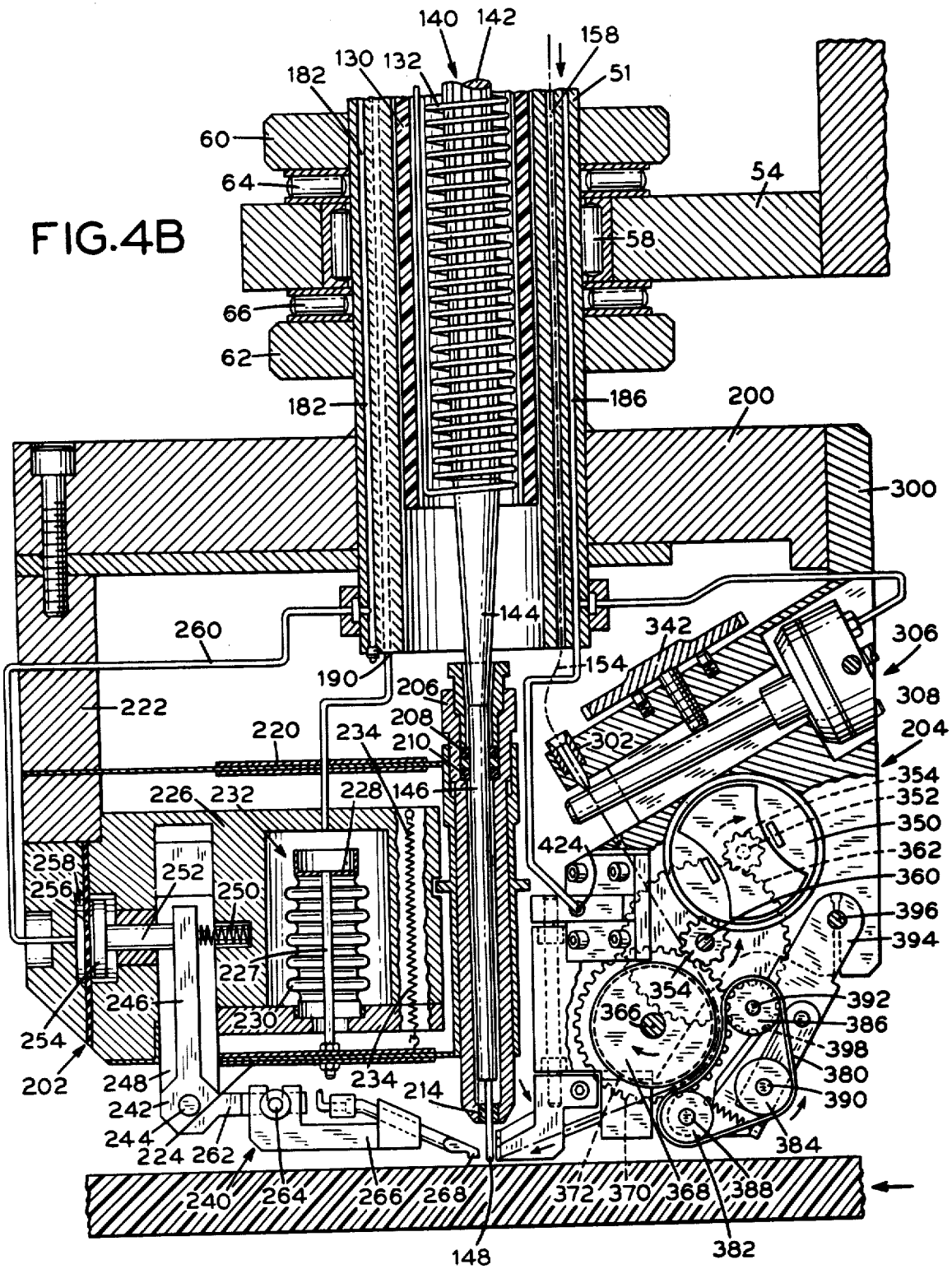
FIG. 4B is an enlarged side view, in section, of the lower portion of the unit of FIG. 4A.

Referring to the drawings and particularly FIGS. 1 and 1A, circuit board base A is of an electrical insulating, dielectric material, such as a reinforced resinous material, and is provided at at least one surface with spaced metal pads B, such as copper pads, spaced and positioned on the surface in accordance with the conductors or wires to be affixed and attached thereto and with the electrical or electronic components to be accommodated thereon. As best shown in FIG. 1A and as will be described in more detail later herein, conductors or wires C are affixed at their ends to selected of the metal pads B and intermediate their ends to intermediate pads B which may be, and preferably are, of metal, such as copper, or may be of thermoplastic.

Metal pads B, FIGS. 1, 1A, 2 and 2A are oval, in shape, and may be affixed to or embedded in the surface to which conductors C are to be applied or, as best shown in FIGS. 2C, 2D, may be pins extending through base A, from surface to surface. Where metal pads B extend through base A the surface portions of the pads may be oval and the portion extending through base A might be circular. The circular portion of pads B might be solid and left solid such as shown at B', FIG. 2C or may later be drilled or drilled before wiring such as shown at B'', FIG. 2D.

Board base A, FIGS. 1, 1A, 2, 2C, 2D may be uncoated or may be coated such as at A', FIG. 2A, with a heat sensitive, or solvent sensitive adhesive or an adhesive sensitive and activatable in some other manner. Adhesive coating A' might extend over the full surface of base A or might be limited to a pattern under conductors C such as by applying adhesive A' to base A as a strip or ribbon as conductor C is fed and applied to the base as later described. Conductor C may be bare wire, such as at C, FIGS. 2, 2A, 2C or may be coated with an adhesive or an insulating coating such as at C', FIG. 2B.

Referring now to the apparatus, particularly FIG. 3, support 2 is mounted in a fixed position, at 4 and 6, above table 8. Table 8 is mounted for movement in the directions of arrows 10 and 12, by reversible electric motors 14, 16 connected, respectively, by worm screws 18 and 20 and nuts 22 and 24 to table 8. In the embodiment illustrated in FIG. 3, four identical circuit board bases A, designated 26, 28, 30 and 32, are affixed to the surface of table 8, such as by clamps, not shown, at the edges of the bases.

Mount 34 is fixed to support 2. In the embodiment illustrated, four identical units, generally designated 36, 38, 40, 42, are mounted one at each of the corners of mount 34. For purposes more fully described hereinafter, the four units are interconnected for simultaneous rotation about their respective vertical axis on mount 34 by chain 44 driven by sprocket 46 and electric motor 48. Idler sprockets 50 and 52 engage chain 44 and maintain the chain in driving engagement with sprocket 46 and units 36, 38, 40 and 42.

Because of the identity, only unit 36 will be described, it being understood that, except for location on fixed mount 34, units 38, 40 and 42 are identical to described unit 36.

Referring to FIGS. 4A and 4B, the unit of the instant invention includes a hollow tube 51 mounted for rotation on fixed mount 34 by brackets 52 and 54 and bearings 56 and 58. Collars 60 and 62, FIG. 4B, are fixed to tube 51 and, through thrust bearings 64 and 66, support tube 51 for rotation about its axis when chain 44, in meshing engagement with sprocket 68, keyed to tube 51, is driven by motor 48 in the manner to be described.

An elecrical slip ring assembly, generally designated 72, is fixed to the upper end of tube 51 by through bolts, one being shown at 74, FIG. 4A. In the embodiment illustrated, slip ring assembly 72 includes a plurality of circular electrically conductive rings or discs 76, 78, 80, 82, 84 and 86 insulated, at the bottom, by disc 88 of non-conductive material and, from each other, by non-conductive discs 90, 92, 94, 96 and 98. Through bolts such as 74 engage non-conductive disc 100 to hold the slip rings assembled. At their outer peripheral edges, conductive discs 76, 78, 80, 82, 84 and 86 engage brushes 102, 104, 106, 108, 110 and 112 in brush holders 114, 116, 118, 120, 122 and 124 mounted in fixed position on fixed mount 34.

Electrical insulation liner 130, of non-conductive material, extends axially along the inner wall of tube 51 from the upper tube end, FIG. 4A, to just above the lower tube end, FIG. 4B. Ultra-sonic energizing coil 132, in liner 130, is connected at one of its ends 134 to conductive ring 80 and at the other of its ends 136 to conductive ring 82. As will be explained in greater detail later herein, coil 132 is energized through ends 134 and 136, conductive rings 80 and 82 and brushes 106 and 108. An ultra-sonic transducer, generally designated 140, has an upper portion 142 of laminated metal extending downwardly through coil 132 in liner 130 of hollow tube 51. A horn section tapers inwardly at 144 into a cylindrical section 146 and terminates in guide 148.

Conductor guide 150, having a base 152 for receiving conductor 154 and a cap 156 through which conductor 154 passes, is mounted in the end of slip ring assembly 72 forming a closure over the end of tube 51 therewith. For purposes more clearly described later herein, conductor 154 passes downwardly through the center of slip ring assembly 72 and into and through bore 158 in tube 51.

Collar 160, FIG. 4A, is mounted in fixed position on tube 51 and with "O" rings 162, 164, 166, 168, 170, 172 and 174 forms air tight manifolds at 176, 178 and 180 around tube 51. For reasons more apparent later herein, air manifold 176 connects to bore 182 in tube 51 and is connected by fitting 184 to a source of air pressure, not shown. Manifold 180 connects to bore 190 and is connected by fitting 192 to a source of air pressure, not shown.

Referring again to FIG. 4B, support 200 is fixed to tube 51. Guide and soldering control assemblies, generally designated 202, are mounted to one end of support 200 at one side of guide 148 and conductor feed assembly, generally designated 204, is mounted to the other end of support 200 at the opposite side of guide 148.

Cylindrical housing 206 encases cylindrical section 146 at the upper end of guide 148 and is insulated therefrom, for purposes more apparent later herein, by "O" rings 208 and 210 and sleeve 214.

The conductor control assembly includes upper leaf spring 200, connected at one of its ends to housing 206 and at its other end to mount 222 fixed to support 200, and lower leaf spring 224 connected at one of its ends to housing 206 and, at its other end, to control housing 226 fixed to mount 222. Intermediate its ends leaf spring 224 is connected by piston rod 227 to bellows piston 228 of bellows 230 in air cylinder 232. Coil spring 234 is connected, at one of its ends, to leaf spring 224 and, at its other end, to control housing 226. Coil spring 234, through leaf spring 224 and housing 206, biases guide 148 out of engagement with the work pieces. By admitting air, under pressure, to cylinder 232, leaf springs 224 and 220, through piston 228 and piston rod 227, are biased downwardly to engage guide 148 with the work piece. The combined spring actions of leaf springs 220 and 224 and coil spring 234 bias guide 148 away from the work pieces when air pressure in cylinder 232 is released.

Referring next to FIGS. 4B, 13, and 14, the soldering assembly, generally designated 140, may be incorporated in and used with the assembly of the invention to solder and join the wire scribed with the apparatus to terminal points on the base or board or the soldering assembly might be omitted and the wires might be joined to terminal points by energizing guide 148, as later described.

Soldering assembly 140, when incorporated in its preferred embodiment in the apparatus of the invention, includes "L" shaped arm 242 pivoted at 244 to control housing 226 with one of its legs 246 extending upwardly therein, in recess 248. Adjacent its upper end, leg 246 is engaged at one of its sides by compression spring 250 and, at its other end, by piston rod 252 of piston 254 connected to diaphram 256 in air chamber 258. Air chamber 258 is connected by conduit 260 to air bore 182. Leg 262 of arm 242 is connected by pin 264 to one end of soldering head carrier 266. For reasons more apparent hereinafter, head carrier 266 is spring biased on pin 264 so that, when head carrier 266 is rotated clockwise towards the work piece, the spring, not shown, will be tensioned and head carrier 266 will rotate, slightly, on pin 264. Soldering pressure can thus be applied to the joint to be soldered without damage to the work piece or soldering head. Soldering head 268 is connected at 269 to an energizing means, not shown, such as a high frequency pulse generator for energizing and rapidly heating head 268, for example, Circon's Micro Soldering PDS I or PDS II Pulse Dot Systems made and sold by Circon Corp., Santa Barbara, Calif.

Referring, now, to FIGS. 4B, 6, 7, 8, 9, 11, 11A and 12, frame member 300 of conductor feed assembly 204 is mounted on support 200. Spaced guides 302 and 304 are mounted on frame member 300. Conductor 154 passes through guides 302 and 304. A pneumatic clamp, generally designated 306, is pivotally mounted at 308 to frame 300 and includes a housing 310, having an outwardly extending cylindrical bayonet 312 mounted thereon and connected thereto by mounting screws 314, FIGS. 8 and 11, and air-tight diaphram 316, having piston 318 mounted thereon. Piston rod 320 of piston 318 extends axially into bayonet 312. Compression spring 322 is mounted around the piston end of piston rod 320 and is compressed between piston 318 and shoulder 324 on bayonet housing 312. Stop 326 is fixed, by pin 328, to the end of bayonet housing 312, forming a stop-closure at the end thereof. When air, under pressure, is admitted to chamber 330 in housing 310 through inlet 332, diaphram 316, piston 318 and piston rod 320 are moved inwardly, the end of piston rod 320 engages and clamps conductor 154 against stop 326 and spring 322 is compressed. For reasons described in more detail later herein, when disphram 316, piston 318 and piston rod 320 are actuated to clamp conductor 154 against stop 326, conductor 154 is being fed through guides 302 and 304 and pivots clamp 306 counter-clockwise around pivot 308. Compression spring 334, mounted in recess 336 in frame member 300, is compressed by the counter-clockwise movement of clamp 306 and, when air pressure is released from chamber 330, returns clamp 306 clockwise, bringing bayonet housing 312 back into contact with stop 340. For reasons more apparent later herein, stop 240 is threaded into housing 300 and is adjustable therein by knurled handwheel 342 held in adjustment by detents 344 and 346, FIG. 11.

Figure 9:
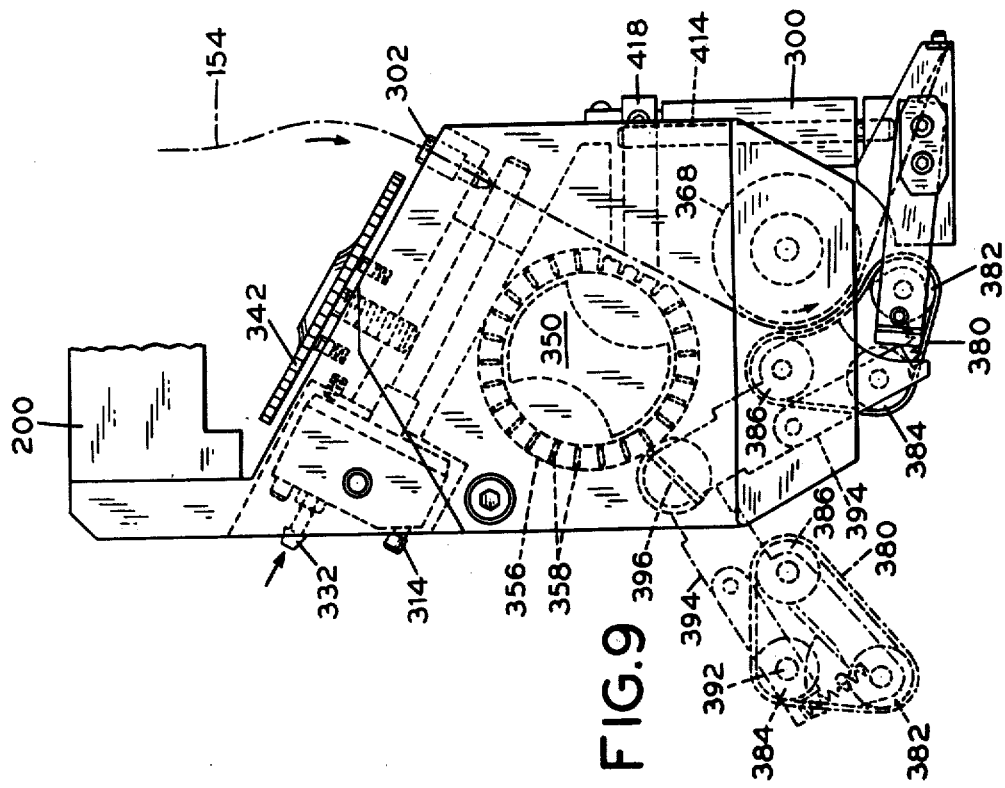
FIG. 9 is a view similar to FIG. 7 but of the opposite side of the feed apparatus of FIG. 6.
Figure 8:
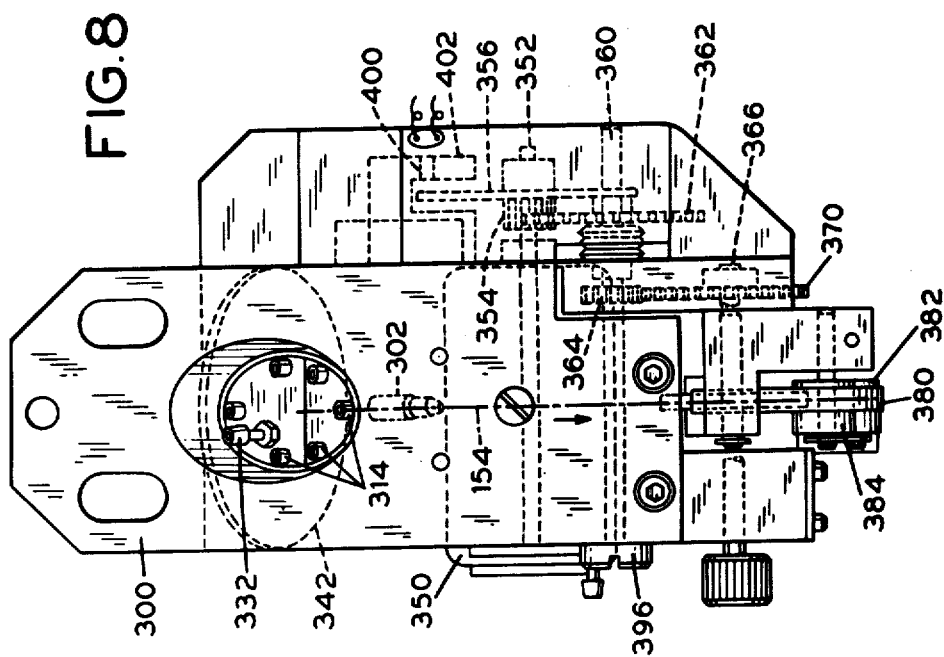
FIG. 8 is a rear view of the feed apparatus of FIG. 6.
Figure 11:
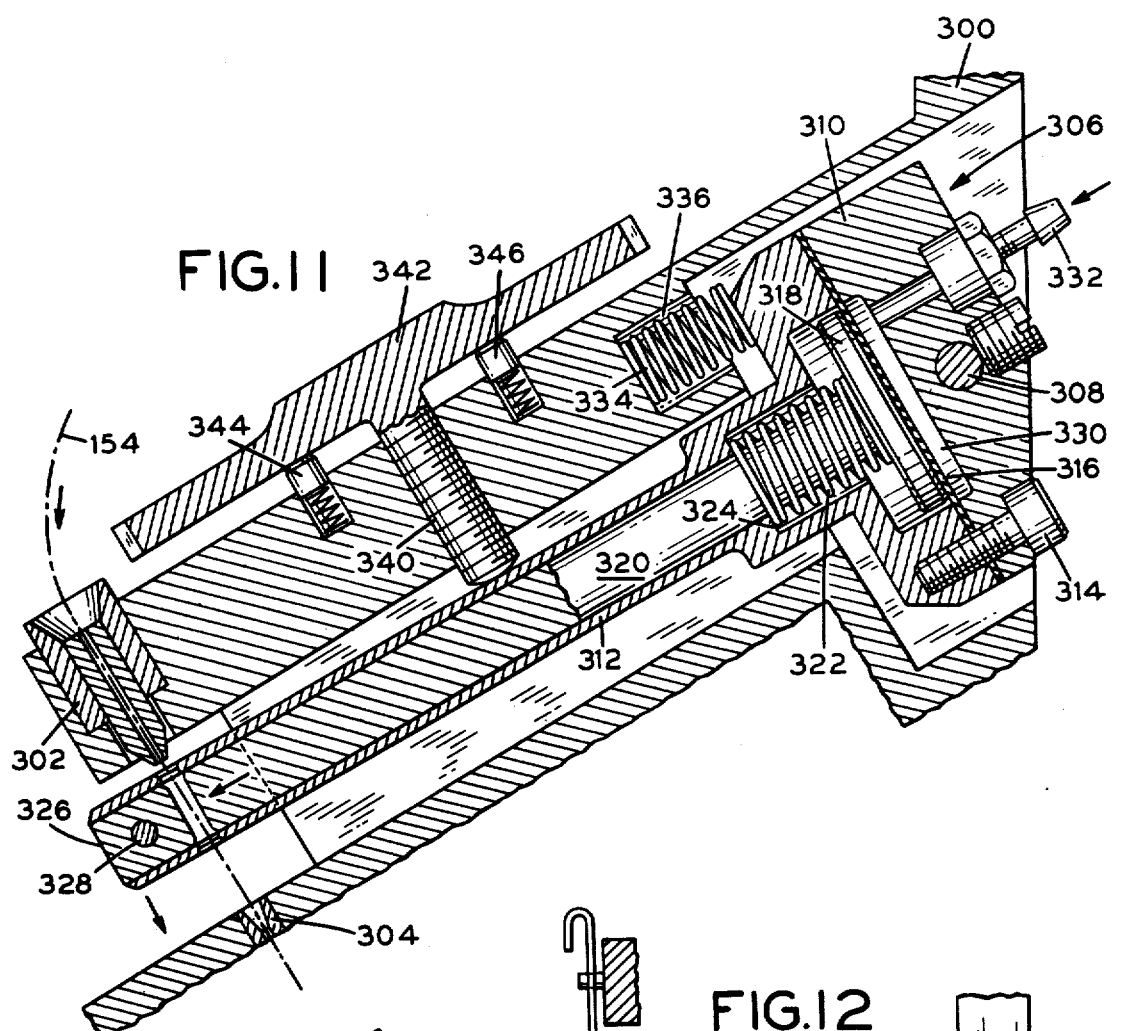
FIG. 11 is a partial sectional view taken at 11—11, FIG. 6.
Figure 11A:
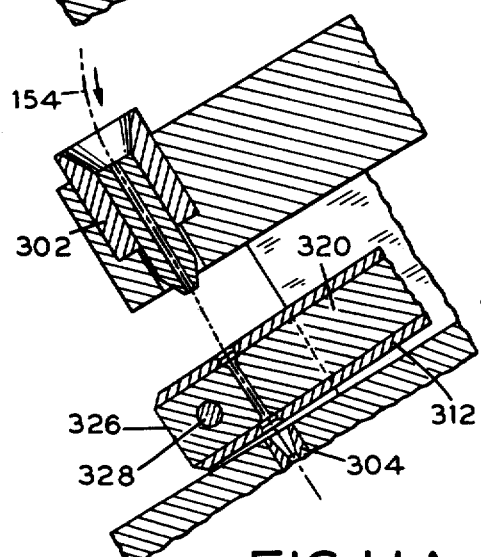
FIG. 11A is a sectional view at the end of the apparatus of FIG. 11, showing such apparatus in another stage of operation.

As best shown in FIGS. 4B, 6 and 8, electric motor 350, having a motor shaft 352, is mounted on frame member 300. Gear 354 and optical disc 356, of opaque material having equally spaced transparent slots 358, FIG. 9, are keyed on motor shaft 352 and are rotated by motor 350, for purposes more apparent later herein. Idler shaft 360, having gears 362 and 364, FIGS. 6 and 8, keyed thereto is mounted for rotation on frame member 300 parallel to motor shaft 352. Idler gear 362 is in meshing engagement with gear 354 on motor shaft 352 and is driven thereby. Shaft 366, FIGS. 4B, 7 and 8, is mounted for rotation on frame member 300 parallel to motor shaft 352 and idler shaft 360. Conductor drive wheel 368 and gear 370 are keyed to shaft 366 and are driven thereby. As best shown in FIGS. 4B, 7 and 10, where conductor 154 is a wire, group of wires, a filament, group of filaments or a circular conduit, drive wheel 368 may be grooved around its periphery, such as at 372. Where a ribbon or flat strip of metal foil is employed as conductor 154, drive wheel 368 will, or course, be without the groove.

Endless belt 380, FIGS. 4B, 7 and 10, of flexible material, such as fabric, reinforced rubber or plastic, is mounted on pulleys 382, 384 and 386 mounted, respectively, on shafts 388, 390 and 392, in turn mounted for rotation on belt frame 394 pivoted, at 396, to wire feed assembly frame member 300. As shown in phantom in FIGS. 7 and 9, belt 380 is swung out of contact with the surface of wheel 368 and conductor 154 by pivoting belt frame 394 about pivot 396. With belt 380 out of engagement, conductor 154 can conveniently be threaded. With belt 380 locked into engagement with drive wheel 368 and conductor 154 in contact with wheel 368, gear 398, FIG. 4B, keyed to shaft 392, is in driving engagement with gear 370. Thus, conductor 154 is engaged by belt 380 with wheel 368 and is driven thereby.

For purposes more apparent later herein, the periphery of opaque disc 356, with its equally spaced slots 358, rotates past photocell unit 400, mounted in arm 402 on frame 300, FIGS. 6, 8.

Figure 12:
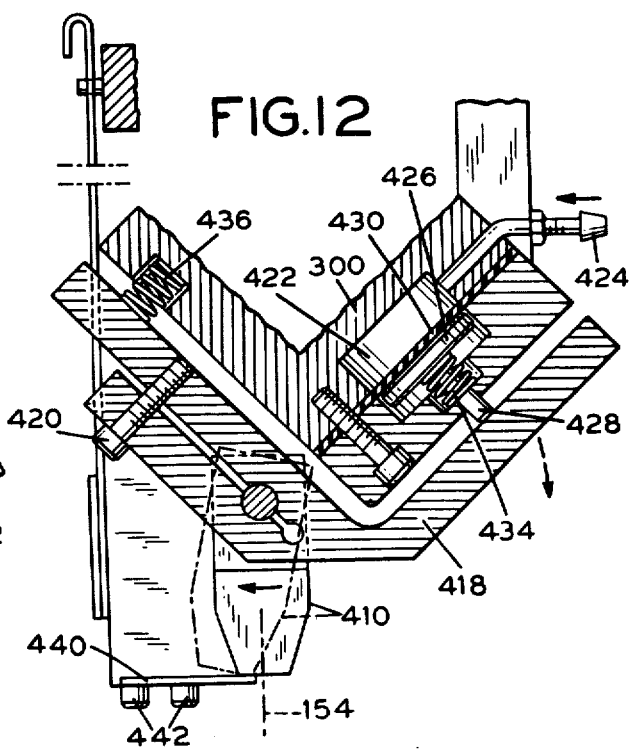
FIG. 12 is a partial sectional view taken at 12—12, FIG. 6.

Referring now particularly to FIGS. 6, 7, 12 and 13, guide head 410, having a guide passage 412 for conductor 154, is clamped to the end of shaft 414 by clamping screw 416. Shaft 414 is mounted for rotation in frame 300. An "L" shaped actuating arm 418, FIG. 12, is clamped to the upper end of shaft 414 by clamping screw 420. Compressed air chamber 422 is connected at 424 to compressed air line 186, FIGS. 4B and 12. Piston 426, having a piston rod 428 in engagement with one leg of actuating arm 418, is mounted on diaphram 430 clamped between cover 432 and frame 300. For purposes more fully apparent later herein, compression spring 434, mounted around piston rod 428 and compressed between cover 432 and piston 426 returns piston 426 and diaphram 430 to retracted position when air pressure in chamber 422 is released. Compression spring 436 mounted between frame 300 and the other leg of actuating arm 418 biases arm 418, shaft 414 and guide lead 410 to the forward scribing wire feeding position shown in full line in FIG. 12. Knife blade 440, FIG. 12, is mounted by screws 442 in fixed position adjacent to the wire exit end of guide head 410 and, with guide head 410, when the guide head is rotated to the phantom line position of FIG. 12, cuts and severs the scribing wire as scribing of each circuit is completed. The cut or severed end of the scribed wire is pressed into and affixed to the heat sensitive surface of the base.

As best shown in FIG. 14, where the conductor to be applied will be a wire, group of twisted wires, a filament, group of filaments or a circular conduit, the side of guide 148 facing guide head 410 has, extending angularly and downwardly toward the bottom end of the guide, a groove 149 having parallel side walls 149a, 149b. Side walls 149a, 149b, channel and guide the conductor as it is fed into groove 149 at the side of guide 148 to the tip of guide 148 where groove 149 is relatively shallow with respect to the conductor thickness and the wall of groove 149 is arcuate. Where the conductor to be applied is a flat ribbon or strip, groove 149 is shaped to receive and guide the flat ribbon or strip.

As has been noted, the apparatus of the instant invention might include a soldering assembly such as assembly 240, for soldering and joining the scribed wire to terminal points or the soldering assembly might be omitted and the wire might be soldered, brazed or welded to the terminal points by ultra-sonic energization of guide 148. Where a soldering assembly and soldering or joining of the conductor ends to the terminals as the board is being scribed are employed, it has been found to be of particular advantage to provide a gas blast at the soldered terminals during the soldering. To accomplish this, as best shown in FIG. 16, guide head 410 is provided, along its opposite sides, with gas passages 444, 446, interconnected to a gas supply at 450. Gas passages 444 and 446 discharge, angularly, toward conductor 154 discharged from guide passage 412. Inert gas might be introduced at 450 and discharged through passages 444, 446 to drive off any gases generated when heated soldering head 268 is brought into contact with the scribed wire.

In the operation of the apparatus of the invention, a circuit board blank to be scribed is centered on table 8 relative to each of the scribing units 36, 38, 40 and 42. All four of the units 36, 38, 40 and 42 may be actuated, each to scribe a circuit board blank concurrently with the other units or some of the units may remain inactive while the other of the units are scribing boards. In any event, the circuit board blanks to be scribed are centered on and fixed to table 8 relative to their respective scribing units and all boards are simultaneously moved along "x" and "y" axes relative to their respective scribing units by motors 14 and 16, and worm screws 18 and 20. At the same time, the scribing units 36, 38, 40 and 42 are simultaneously rotated realtive to board 26, 28, 30 and 32, depending upon the direction of table movement and circuit board scribing. It is obvious, of course, that the scribing units, rather than the base and boards, might be moved and that such movement might be accomplished by the combined movements of the base and units. For example, the base and boards might be moved along one axis, such as the "x" axis, and the units might be moved along the other axis, such as the "y" axis.

Each of the scribing units has its own conductor supply such as a spool, not shown, and each unit has its own feed, cutoff, scriber, etc. All units that are scribing are actuated simultaneously in a manner described later, herein. For purposes of illustration, the operation of one unit is described.

As best shown in FIGS. 4A, 4B, conductor 154 is threaded from the supply, not shown, through guide 150 into and through bore 158 in tube 51 and out of bore 158 into and through guides 302 and 304. Conductor 154 is then threaded around drive wheel 368, between wheel 368 and endless belt 380. From drive wheel 368 conductor 154 passes through guide 412, into groove 419 in stylus 148, FIG. 14, and under the stylus. For reasons more apparent later herein, groove 149 is just a little larger than conductor 154, allowing the conductor to pass freely therethrough while, at the same time, controlling the positioning and placing of the conductor.

At the end of each scribed circuit, the conductor scribed onto the circuit board during the preceding scribing is severed from the end of conductor 154 in the scribing unit by knife 440, and in a manner later described, a predetermined conductor length is fed out of the end of the guide passage 412 in guide head 410. Thus, the leading end of conductor 154 is under guide 148 when the scribing unit is at rest.

With the unit at rest and the leading end of conductor 154 under guide 148 the scribing unit is energized, energizing air cylinder 232, advancing piston 228 and piston rod 227 downwardly and, through leaf spring 224, bringing the end of guide 148 into engagement with the lead end of conductor 154 and engaging guide 148 and the lead end of conductor 154 with the surface of metal terminal pad B on the blank A, FIGS. 1, 1A, 2, 2A, 2B, 2C, 2D from which the scribing of the conductor is to commence.

Simultaneously with the energizing of air cylinder 232 and the engagement of the lead end of conductor 154 and guide 148 with the surface of metal terminal pad B, the lead end of conductor 154 is fixed to terminal pad B. This is accomplished by soldering, brazing or welding the conductor end to the pad and might be accomplished by energizing soldering head 268, where the soldering assembly 240 is employed or by energizing ultra-sonic coil 132 and ultra-sonic transducer 140 to vibrate guide 148 and the end of conductor 154 at high frequency and heat and solder, braze or weld, as the case may be, the end of conductor 154 to the oval end of terminal pad B. Whether accomplished with soldering assembly 240 or the ultra-sonic assembly 140, the energy is applied in a pulse or pulses to heat and solder, braze or weld the conductor end of the metal terminal. When the conductor end has been so heated and soldered, brazed or welded, as the case may be, to the metal terminal the assembly is de-energized and, in instances where soldering assembly 240 is employed, air is released from air chamber 158 and compression spring 250 raises soldering head 268. For reasons more apparent later herein, air cylinder 232 remains energized maintaining guide 148 and conductor 154 engaged thereby in engagement with the surface of blank A.

At about the same time as soldering assembly 240 or ultra-sonic assembly 140, as the case may be, in de-energized, table drive motors 14 and 16 are activated, moving table 8 and the circuit board blanks thereon in a direction in accordance with a preprogrammed sequence, as will be later described. At the same time that motors 14 and 16 are activated, motor 48, FIG. 3, is also activated, turning the units, with guide 148, thereon, in a direction aligned with the table and circuit board blank movement.

Concurrent with the activation of drive motors 14, 16, 48, conductor drive motor 350 is also energized. Thus, conductor 154 is fed by drive wheel 368 and endless belt 380 through guide head 410 and guide 148 onto the surface of the circuit board blank.

Once started, the feed of the conductor onto the surface of the circuit board blank continues to the end of the preprogrammed circuit. At the end of the programmed circuit, compressed air is fed to chamber 330, advancing piston 318 and piston rod 320 in bayonet 312 and gripping conductor 154 between the end of the piston rod 320 and stop 326. Simultaneously, air under pressure is fed to chamber 422, advancing piston 426 and piston rod 428 against activating arm 418 to pivot wire guide head 410 clockwise and causing conductor 154, being fed through head 410, to be severed by knife 440. While conductor 154 is being severed by knife 440, the conductor is gripped between the end of piston rod 320 and stop 326. Conductor feed motor 350 is stopped but air pressure is momentarily maintained in air cylinder 232, holding guide 148 in engagement with conductor 154 and the surface of the board blank continues to move thereunder on table 8 until the cut, trailing end of the conductor scribed in the circuit is on the surface of metal terminal pad B.

When the trailing end of conductor 154 is on the surface of terminal pad B, drive motors 14, 16 and 48 are de-activated leaving trailing end of conductor 154 resting on metal terminal pad B. The trailing end of conductor 154 is then fixed to metal terminal pad B by soldering, brazing or welding by engaging soldering head 268 with such trailing end and energizing the soldering head, where soldering assembly 240 is employed, or by energizing ultra-sonic coil 132 and ultra-sonic transducer 140 where ultra-sonic assembly 140 and conductor guide 148 are employed for soldering, brazing or welding. In the latter instance, of course, guide 148 is held in contact with the trailing end of conductor 154 until the connection has been made. In the former instance where soldering assembly 240 is employed, guide 148 is raised at the same time that motors 14, 16 and 48 are de-activated.

After the preceding circuit has been scribed the trailing conductor end has been soldered, brazed or welded and housing 206 and guide 148 have been raised, the pre-recorded program advances table 8 and the board blank affixed thereto to the next terminal point where a scribed circuit is to commence. The leading end of conductor 154 is soldered, brazed or welded to the metal terminal pad B at such next terminal point and the feeding, scribing, cutting, stopping, soldering, brazing and welding sequence is repeated for each circuit until all of the circuits in the prerecorded program have been scribed onto the board. In addition to the affixing of the ends of the conductor by soldering, brazing or welding the ends to terminal pads, at spaced points along its length or at points where the direction or path in which such conductor is being scribed is abruptly changed or inflected, the conductor is tacked to the surface of the board blank with an adhesive while such conductor is being scribed. The scribed boards are removed from table 8 and replaced with fresh circuit board blanks. The same pre-recorded program might then be repeated with the fresh board blanks or another pre-recorded program might be employed.

In the present invention, the conductor being scribed or written onto the board or blank surface is positioned by guide 148 and fixed to the board by the soldering, brazing or welding of the conductor ends to the metal terminals on the board or blank surface and by tacking the conductor to the board surface where the conductor path is abruptly changed or inflected. Later, as will be described, the scribed conductors are affixed or attached along their length to the board by a separate potting operation. To assure that the conductors will remain on the board or blank in the paths scribed, it is particularly helpful in the practice of the invention to feed and scribe the conductors to the board in direct relationship to the board movement during scribing.

In order that this might be attained, it has been found to be useful to utilize stepping motors as the reversible motors 14 and 16 used to drive table 8 and to connect the motors to table 8 with a worm screw. Thus, each pulse to the motor will move table 8 along the "x" or the "y" axis by, for example, 1 mil or a multiple thereof. Slots 358 on optical disc 356, FIG. 9, are spaced so that each slot corresponds to a unit feed of conductor by electric motor 350 and drive wheel 368, for example, 1 mil or a multiple thereof. Thus, photocell 400 produces a pulse for each unit of conductor feed. For purposes of the description which follows, the length of table movement for each motor pulse and the length of conductor unit feed for each optical disc impulse is taken to be 1 mil. In both instances, however, the units may be set for other lengths with equal utility, provided appropriate changes in scaling are made. Likewise, an encoder, such as an optical disc and slots, might be employed with the drive table motors in lieu of the stepping motors and motor drive pulses.

Figure 17:
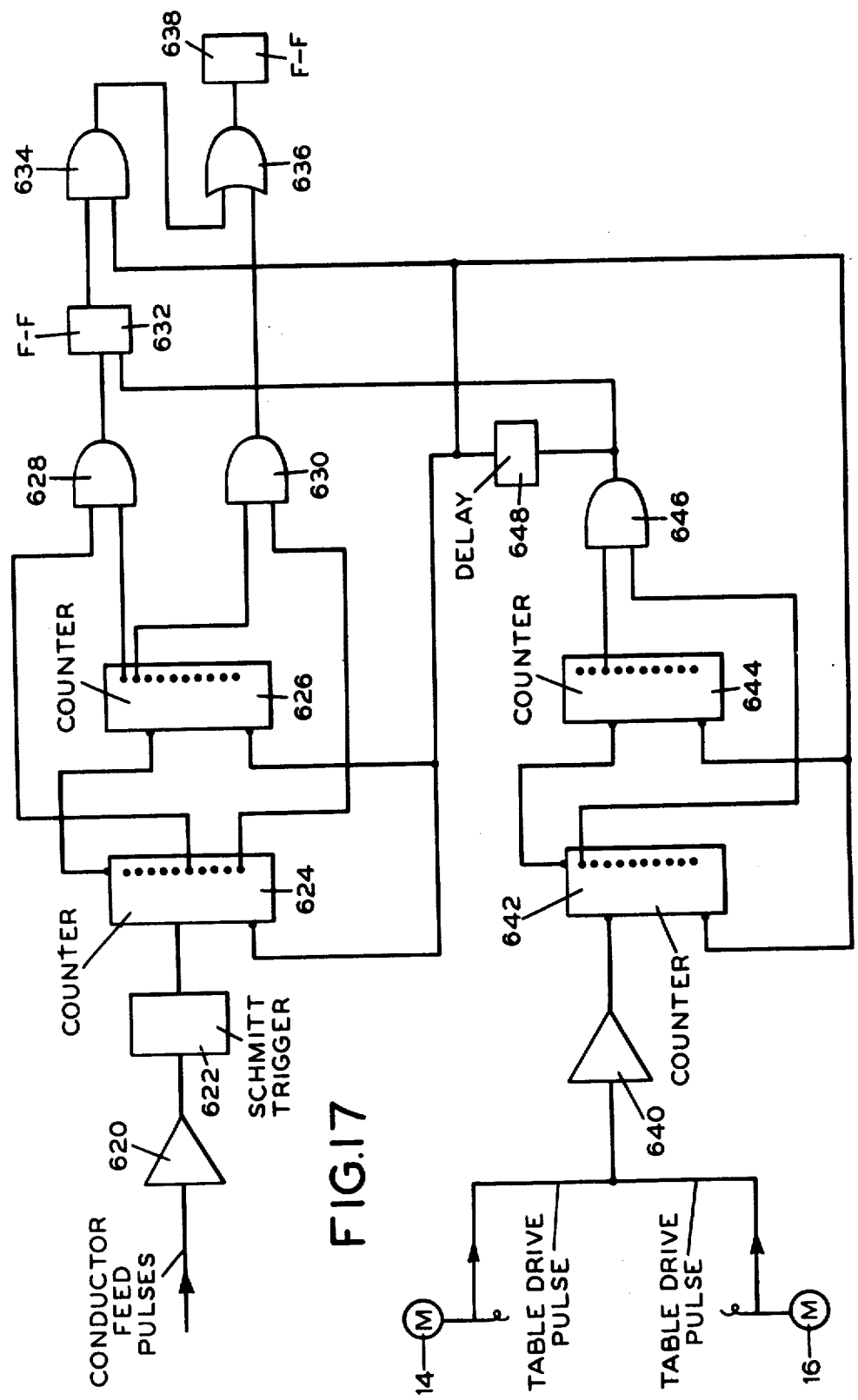
FIG. 17 is a schematic diagram of a comparator circuit for comparing conductor feed and table movement.

Referring now to FIG. 17, with motor 14 or motor 16 energized to move table 8, the motor drive pulses to motors 14 and 16, each indicating 1 mil of movement, are supplied to the input of integrator 640. Pulses from photocell 400, each indicating 1 mil of conductor feed, are supplied to the input of linear amplifier 620. The output of amplifier 620 is fed to Schmitt trigger 622, the output of which is fed to the input of decade counter 624. Counter 624 is connected in series with decade counter 626. Thus, counter 624 is the "units" counter while counter 626 is the "tens" counter.

The output of units counter 624 corresponding to the fifth pulse received is connected to AND gate 628 while the output corresponding to the ninth pulse is connected to AND gate 630. The output of tens counter 626 corresponding to the tenth conductor feed pulse is connected to AND gate 628 while the output corresponding to the twentieth conductor feed pulse is connected to AND gate 630. AND gate 628 is connected to the set input of flip-flop 632. The reset input of flip-flop 632 is connected to the output of AND gate 646. The output of flip-flop 632 is connected to one input of AND gate 634. The output of AND gate 634 is connected to one input of OR gate 636. The other input of OR gate 636 is connected to the output of AND gate 630. The output of OR gate 636 is connected to control and alarm flip-flop 638.

Still referring to FIG. 17, the table drive pulses to motors 14 and 16 are integrated by integrator 640, the output of which is fed to decade counter 642. Counter 642 is connected in series with decade counter 644. Thus, counter 642 is the "units" counter while counter 644 is the "tens" counter. The zero output of counter 642 and the output of counter 644 corresponding to the twentieth drive pulse are connected to AND gate 646. The output of AND gate 646 is connected to the input of delay circuit 648 and to AND gate 634. The output of delay circuit 648 is connected to the reset terminals of counters 624, 626, 642, 644 and to AND gate 634.

As already noted, in the illustrative embodiment of the invention the apparatus is arranged so that each table drive pulse and each conductor feed pulse is indicative of 1 mil of movement and feed, respectively. For purposes of illustrating the operation of the monitoring system, limits will be set at fifteen and twenty-nine conductor feed pulses or mils of conductor feed for each twenty table movement pulses or mils of table travel. As will be obvious to those skilled in the art, other limits may be employed.

The monitoring system operates as follows: Each fifth conductor feed pulse from units counter 624 and each tenth pulse from tens counter 626, are fed to AND gate 628 which produces an output corresponding to the count "15". Each ninth conductor feed pulse from counter 624 and each twentieth conductor feed pulse from counter 626 are fed to AND gate 630 which produces an output corresponding to the count "29". Similarly, AND gate 646 produces an output corresponding to the twentieth table drive pulse.

Flip-flop 632 is set by the fifteenth conductor feed pulse and reset by the twentieth table drive pulse which, after a suitable delay, also resets all of the counters. Because flip-flop 632 has been reset by the twentieth table drive pulse, flip-flop 632 produces no signal at the input of AND gate 634. Thus, when the delayed twentieth table drive pulse arrives at AND gate 634, no output is produced and alarm flip-flop 638 is not triggered. If, on the other hand, the twentieth table drive pulse reaches flip-flop 632 before the fifteenth conductor feed pulse then flip-flop 632 produces a signal at the input of AND gate 634 which combines with the delayed twentieth table drive pulse from delay relay 648 and, through OR gate 636, triggers control and alarm flip-flop 638. The triggering of flip-flop 638 cuts off the power to table drive motors 14 and 16 and conductor feed motor 350, stopping the apparatus. At the same time, an alarm signal is actuated by flip-flop 638. There is one such monitoring system for each of the scribing units 36, 38, 40 and 42.

As has already been noted, the ninth and twentieth conductor feed pulses are fed to AND gate 630 which, in turn, is connected to OR gate 636 and to control and alarm flip-fop 638. If counters 624 and 626 are not reset by the twentieth table drive pulse, then the twenty-ninth conductor feed pulse will trigger control and alarm flip-flop 638. Normally, however, counters 624 and 626 are reset by the twentieth table drive pulse and AND gate 630 never produces an output at the twenty-ninth counter feed pulse. Thus, if a twenty-ninth conductor pulse occurs before a twentieth table pulse, then the alarm is triggered and the wiring operation is stopped.

Finally, it should be noted that counters 624, 626, 642 and 644 are reset each time the wire feed and table drive are stopped.

Except for tacking where conductor lengths are substantial or the scribed conductor abruptly changes direction, the conductors on the conductor scribed circuit board blanks, when such board or blank is removed from table 8, are affixed to the board or blank by soldering, brazing or welding at the conductor ends but are free of the board intermediate such ends. In those instances where the board blank or conductor is coated with a heat sensitive adhesive before the ends of the conductor are soldered, brazed or welded and the conductor is scribed onto the board or blank surface, the conductor scribed board blank, after it is removed from table 8 of the scribing apparatus is placed, alone or with other scribed boards, in a press and pressure and heat are applied to the heat sensitive adhesive to activate the adhesive and affix or attach the conductors along their lengths to the board or blank surface. Heat may be applied externally or by applying an electrical load to the conductor wires, the electrical resistance in such conductor wires causing the wire temperature to elevate and heat and activate the heat sensitive adhesive.

The board blank and conductor employed in the scribing of the conductor in the instant invention may be uncoated at the time of scribing and an adhesive might be applied during scribing or after scribing has been completed.

Where the adhesive is to be applied during scribing, a paste or dry ribbon of heat sensitive, pressure sensitive, solvent sensitive or other activatable adhesive might be applied to the conductor as it passes through guide head 410 by feeding the adhesive in paste or dry ribbon form through conduit 411 in guide head 410, FIG. 13A, or by applying the adhesive as a paste or dry ribbon to the surface of board blank A as the conductor is applied to the blank surface. Thus, the paste or dry ribbon may by applied to the surface through conduit 413, FIG. 13B, as head 410 and guide 148 apply conductor 154 to the board blank surface. The board blank, after it has been scribed with conductors and removed from table 8 is placed in a press and, while pressure is applied, the adhesive is activated by heat, or solvent, or other means, depending upon the characteristics of the adhesive.

As has already been noted, conductor 154 may be insulated or uninsulated. Where conductor 154 is uninsulated and it is desired to scribe one conductor to cross over another an insulating tape might be applied between the conductors as the second conductor passes over the first by feeding a ribbon of such tape through conduit 413, FIG. 13B, and applying such tape over the first conductor where such conductors are to cross as the second conductor is being scribed.

Where the board blank and conductor employed in the scribing are both uncoated, the adhesive might be applied after scribing has been completed by laying over such scribed board or the conductor pattern scribed thereon a sheet or mask of the activatable adhesive before such board is placed in the press. Such sheet or mask of activatable adhesive may be heat responsive, solvent responsive or activatable in some other manner and activated while pressure is applied.

In the process of the instant invention, the conductor scribing and the adhesively affixing or attaching the conductors along their lengths to the board or blank surface are carried out as separate operations. Thus, the feeding, measuring of the conductor length and scribing of the conductor along the conductor paths on the board or blank can be carried out at optimum speed without regard to adhesively affixing the conductor along its length to the board or blank surface. Likewise, the affixing or adhesively attaching the conductors along their lengths can be carried out at optimum speed and under optimum conditions without regard for the scribing operation. This results in more efficient utilization of the scribing equipment and controls, therefore, reduces unit costs and improves circuit board quality.

The apparatus and processes of the instant invention, while described in connection with a circuit board for interconnecting electrical and electronic components, may also be utilized in scribing boards for interconnecting other types of components, such as optical, pneumatic, hydraulic and similar components. In interconnecting such optical, pneumatic or hydraulic components conductors other than wires would be employed. For example, with optical components, an optical conductor, such as a coated optical fiber, would be utilized. In the instance of pneumatic and hydraulic components, small diameter conduits would be employed as conductors. The ends of such optical, pneumatic or hydraulic conductors may, of course, be unsuited for soldering, brazing or welding. When such is the case, an adhesive or cement with a highly volatile solvent might be employed for attaching or affixing the conductor ends to the board surface during scribing. Such adhesive or cement might be applied to the conductor ends and board blank surface through conduit 411, FIG. 13A, before scribing of each circuit is commenced and after the scribing of each circuit is completed and would, of course, be controlled by the computer program controlling the scribing apparatus. As used in the description and in the appended claims it is to be understood the "conductor" is intended to include other conductor means as well as wires.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the inventions claimed.

What is claimed:

1. A process for extending and fixing continuous conductors between pre-established pairs of contact points on a board base surface along straight paths between selected of said pairs and along inflected paths between selected other of said pairs, the steps comprising:

(a) providing a board base having pads affixed to the board surface at pre-established contact points and points where conductor inflections are to be formed and mounting said board base on a table movable relative to a conductor feed guide, with the surface of said board base having said pads facing said guide;

(b) engaging the end of the conductor to be extended and fixed to said board surface with the pad at the first of a pair of pre-established contact points on said board surface and affixing said end to said first pad;

(c) with said end affixed to said first pad and where said conductor is to be extended and fixed to said board surface between a pair of contact points in a straight path, while feeding said conductor with said guide, moving said board base and said guide in a straight path relative to each other and extending said conductor from said pad at the first of said pair of contact points to the pad at the second of said pair of contact points, severing said conductor and engaging and affixing the severed end of said conductor to said pad at said second contact point;

(d) with said end affixed to said pad at said first of a pair of contact points and where said conductor is to be extended and fixed to said board surface between the pair of contact points in an inflected path, while feeding said conductor with said guide, moving said board base and said guide in a straight path relative to each other in a first direction and extending said conductor from said first of said pair of contact points to the pad at the point in such path where said conductor is to be inflected and affixing said conductor at said inflection point to said pad at said inflection point on said board surface, inflecting said board base and said guide relative to each other and moving said board base and said guide in a straight path relative to each other in a second direction and extending said conductor to the pad at the next following inflection point where there is to be more that one inflection in the path, affixing the conductor at the pad at each such inflection point, inflecting said board base and said guide relative to each other and moving said board base and said guide in a straight path relative to each other in a third direction and extending said conductor through inflection points, as aforesaid, until the pad at the second of said pair of pre-established contact points is reached, severing said conductor at said pad at said second contact point and engaging and affixing the severed end of said conductor to said pad at said second contact point;

(e) each time said conductor is severed and the severed end has been affixed to the pad at the second of the pair of contact points, moving said board and said guide relative to each other to engage the end of said conductor with the pad at the first of the next pair of pre-established contact points and repeating said steps until conductors have been scribed between the pads of all of the pre-established pairs of contact points; and (f) after all of said conductors have been extended and affixed to said pairs of contact points on said board base to be connected, removing said board base from said table and affixing said conductors along their lengths intermediate said pads to said board base surface.

2. A process, as recited in claim 1, in which said conductor is affixed to said board blank surface with an adhesive and said adhesive is activated while pressure is applied to said conductor pattern on said board blank surface.

3. A process, as recited in claim 2, in which said board blank surface is coated with said activatable adhesive as said continuous conductor is applied thereon.

4. A process, as recited in claim 2, in which said continuous conductor is pre-coated with said activatable adhesive before said continuous conductor is extended on said board blank surface.

5. A process, as recited in claim 2, in which said activatable adhesive is applied to said continuous conductor as said conductor is being applied to said board.

6. A process, as recited in claim 2, in which said activatable adhesive is applied to the surface of said board blank between said surface and said conductor as said conductor is being applied to said board.

7. A process, as recited in claim 2, in which said activatable adhesive is applied to said board blank and to said continuous conductor pattern after said continuous conductor is extended and applied thereon and before said conductor pattern is affixed to said board blank.

8. A process, as recited in claim 2, 3, 4, 5, 6, or 7, in which said activatable adhesive is heat responsive.

9. A process, as recited in claim 2, 3, 4, 5, 6, or 7, in which said activatable adhesive is solvent responsive.

10. A process, as recited in claim 2, 3, 4, 5, 6, or 7, in which said activatable adhesive is heat responsive and heat is applied to said board and said heat responsive adhesive from an external source while pressure is being applied to said conductor pattern.

11. A process, as recited in claim 2, 3, 4, 5, 6, or 7, in which said activatable adhesive is heat responsive and heat is applied to said board and said heat responsive adhesive by electrical means.

12. A process, as recited in claim 1, in which said pads at said inflection points are adhesive pads and said conductor is affixed to said surface at said inflection points by said adhesive pads.

13. A process, as recited in claim 1, in which said conductor ends are affixed to said pairs of contact points and said conductor is fixed to inflection points intermediate said ends with an adhesive applied to said conductor as said conductor is fed to said board base by said guide.

14. A process, as recited in claim 1, or 13, in which said adhesive is continuously applied to said conductor as said conductor is fed to said board base.

15. A process, as recited in claim 1, wherein said conductor is affixed to said board base surface intermediate said contact points.

16. A process, as recited in claim 15, in which said conductor is affixed to said board base surface continuously.

17. A process, as recited in claim 1, in which said pads at said inflection points are metal pads.

* * * * *